United States Patent

Glock

[15] 3,636,478

[45] Jan. 18, 1972

[54] ACTIVE BALANCED MODULATOR CIRCUIT

[72] Inventor: Erwin Glock, Neckarrems, Germany

[73] Assignee: Licentia Patent-Verwaltungs GmbH, Frankfurt, Germany

[22] Filed: July 14, 1970

[21] Appl. No.: 54,830

[30] Foreign Application Priority Data

July 14, 1969 Germany.......................P 19 35 611.7

[52] U.S. Cl................................332/43 B, 307/241, 330/15, 330/30 D, 332/16 T, 332/47

[51] Int. Cl...........................................................H03c 1/54

[58] Field of Search.....................332/43, 43 B, 44, 31 T, 47; 330/15, 30 D; 307/241, 242

[56] References Cited

UNITED STATES PATENTS

| | | | |
|---|---|---|---|
| 2,994,044 | 7/1961 | Straube | 332/31 T X |
| 3,017,109 | 1/1962 | Briggs | 332/47 X |
| 3,122,715 | 2/1964 | Buck | 332/43 B |
| 3,124,767 | 3/1964 | Pospischil | 332/43 B X |
| 3,550,040 | 12/1970 | Sinusas | 332/44 |

*Primary Examiner*—Alfred L. Brody
*Attorney*—Spencer & Kaye

[57] ABSTRACT

An active balance modulator circuit wherein the active switching elements of the modulator circuit are switched suddenly or in jumps as if controlled by a square wave carrier signal but utilizing a sine wave carrier input signal. Each of the respective switching elements of the balanced modulator circuit is coupled with a further respective switching element to form a pair of differential amplifiers. The carrier wave input signal is utilized to directly control only the further one of the switching elements of each differential amplifier. Further embodiments wherein the further switching elements are simultaneously utilized as the active elements of a second balanced modulator circuit and as the active elements in the diagonal arms of a ring-type balanced modulator circuit are also disclosed.

9 Claims, 3 Drawing Figures

PATENTED JAN 18 1972 3,636,478

Inventor:
Erwin Glock

BY Spencer & Kaye
ATTORNEYS.

ACTIVE BALANCED MODULATOR CIRCUIT

BACKGROUND OF THE INVENTION

The present invention relates to an active balanced modulator which can be controlled by sinusoidal carrier wave voltages and in which the switching elements switch over in sudden jumps, i.e., as though controlled by a carrier wave which is a square wave.

A balanced modulator comprises, in a known manner, two or, in the case of the ring-type balanced modulator, four switching elements, generally transistors, which are connected in parallel for the carrier frequency wave controlling the modulator and are connected in push-pull relationship for the signal frequency to be switched, i.e., the modulating signal. In such modulators the switch elements are controlled by the carrier frequency to act as individual on/off switches in the case of the basic balanced modulator circuit and as pairs of on/off switches in the case of the ring-type modulator circuits. The significant effect of the switch elements in such balanced modulator circuits as an ideal switch, particularly for the suppression of undesired modulation products, i.e., rapid switching from one to the other switching state compared with the period duration of the carrier frequency, is hampered by the curved characteristic of the switching elements, i.e., transistors commonly used today, just as it was with the diodes previously employed in such modulators, which permit the switching elements to become conductive only after exceeding a physically given threshold voltage.

One known procedure for providing the desired rapid transition from one to the other switching state for the switching elements, is to utilize very high generally sinusoidal carrier wave voltages. Such carrier wave voltages can only be produced however with relatively expensive amplifiers having filters connected thereto.

Another possibility for providing rapid switching of the switching elements is to use carrier wave voltages which are relatively small when compared with the above-mentioned process, but which are however rectangular, i.e., square wave, carrier signals. Such carrier waves however also require additional costly efforts or circuitry for their production.

SUMMARY OF THE INVENTION

It is therefore the object of the invention to technically improve the circuit arrangements of the last-mentioned type utilizing square wave signals for controlling the switching of the active elements and to construct such circuits in a more economical manner.

The above object is achieved according to the present invention through the use of differential amplifiers to amplify and transform a sinusoidal oscillation corresponding to the carrier frequency into a rectangular voltage and is characterized in that one of the active elements of the differential amplifier simultaneously forms one of the active switch elements of the balanced modulator circuit while the carrier frequency directly controls only the second ones of the active elements of the differential amplifiers.

According to a further feature of the invention the output of the directly controlled switching elements of the differential amplifier, which is a square wave, can be utilized as the carrier wave input signal, and thus as the control signal, for further conventional balanced modulator circuits.

According to a further feature of the invention the controlled switching elements of each differential amplifier can simultaneously be connected to operate as the active switching elements of a further balanced modulator circuit, thus forming a pair of balanced modulators controlled by a single sinusoidal carrier wave input signal.

According to a still further feature of the invention the controlled switching elements of each differential amplifier are connected in the diagonal arms or branches of the balanced modulator circuit, whereby the circuit operates as a ring-type or double balanced modulator circuit.

DESCRIPTION OF THE PREFERRED EMBODIMENTS

Figure 1:
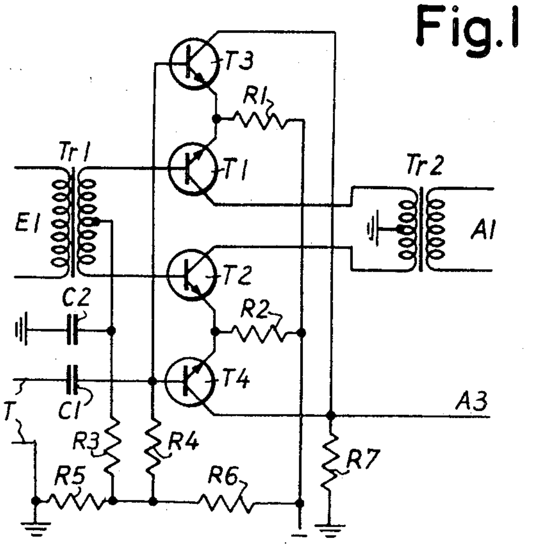
FIG. 1 is a schematic circuit diagram of a basic balanced modulator circuit according to the invention.

In FIG. 1 transistors T1 and T2 together with transformers *Tr1* and *Tr2* form the known basic circuit for a balanced modulator wherein the primary winding of transformer *Tr1* serves as the signal input E1 for the modulating signal and the secondary winding of transformer *Tr2* serves as the output A1 for the converted signal. Each end of the center tapped secondary winding of transformer *Tr1* is connected to the respective base of one of transistors T1 and T2 while the collectors of these transistors are connected to the ends of the center tapped primary winding of transformer *Tr2*. Contrary to the known balanced modulator circuits not only is the center tap of the primary winding of transformer *Tr2* connected to a point of reference potential, e.g., ground, but the center tap of the secondary winding of transformer *Tr1* is also connected to the point of reference potential via a capacitor C2.

According to the invention transistor T1 is coupled with an additional transistor T3 and together with the emitter series resistance R1 common to both transistors forms a first differential amplifier, while the transistor T2 is coupled with an additional transistor T4 and together with the emitter series resistance R2 common to both of these transistors forms a second differential amplifier. The collectors of the supplemental transistors T3 and T4 are connected in common to the point of reference potential.

The bases of transistors T3 and T4 which supplement transistors T1, T2 respectively to form the two differential amplifiers are connected in parallel and via a capacitor C1 to the carrier frequency wave input T.

The bases of all four of the transistors are provided with the same bias, which in the illustrated example is derived from a common base voltage divider consisting of resistors R5 and R6. The resistors R3 and R4 disposed between the terminal of the base voltage divider R5, R6 and the bases of transistors T1 and T2, or the bases of transistors T3 and T4, respectively, serve to decouple the bases of transistors T1 and T2 of the actual balanced modulator circuit from the bases of transistors T3 and T4. The base bias of the four transistors is so selected that the transistors draw a uniform average current without the additional application of the sinusoidal carrier frequency wave input signal at terminal T.

With the circuit just described, the application of the alternating carrier voltage via carrier input T increases or decreases, respectively, the base voltage of transistors T3 and T4 in phase and thus increases or decreases, respectively, the conductivity of these transistors. Due to the known characteristic of differential amplifiers, a very slight increase in the conductivity of the controlled transistor T3 and T4 is sufficient to cause it to take over the entire current flowing through the common emitter series resistor R1 or R2 respectively because the emitter voltage of the other transistor T1 or T2 respectively is thus reduced to such an extent that it blocks. With a very slight reduction in the conductivity of the controlled transistor T3 or T4 the opposite occurs, i.e., the other transistor T1 or T2 respectively of the respective differential amplifier takes over the total current via the emitter series resistor R1 or R2 respectively, so that the controlled transistor blocks completely.

A low alternating carrier voltage is thus sufficient to rapidly switch transistors T1 and T2 of the actual balanced modulator circuit from one to the other of their two switching states, i.e., completely conducting or completely blocked, with the supplemental transistors T3 and T4, respectively, taking up the opposite state.

An advantage of the circuit shown in FIG. 1 is the substantially improved damping of the carrier wave frequency on the input side of the circuit as compared with known circuits.

According to a further feature of the invention, rectangular or square wave signals for controlling further balanced modulator circuits with the same frequency can be taken at an output A3 from a common collector series resistor R7 of transistors T3 and T4 which supplement the transistors T1 and T2, respectively, of the balanced modulator to form the differential amplifiers. This method of providing the square wave signals is particularly advantageous when an odd number of balanced modulator circuits is to be controlled with the same carrier frequency wave.

Figure 2:
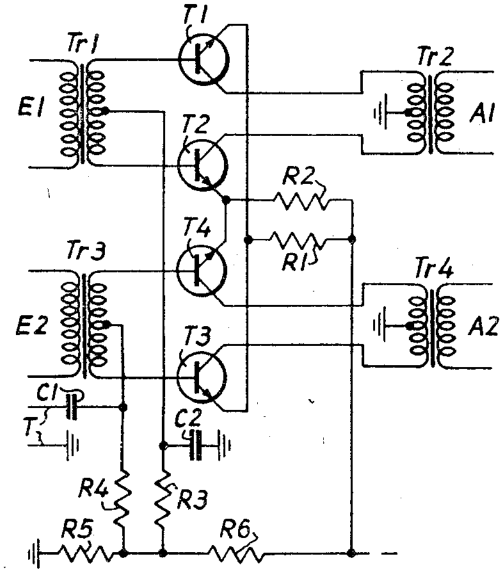
FIG. 2 is a schematic circuit diagram illustrating a modification of the circuit of FIG. 1 to form two balanced modulator circuits controlled by the same carrier frequency signal.

A further feature of the invention is shown in FIG. 2 which is a modification of the basic circuit of FIG. 1 and wherein like elements are designated with the same reference numerals.

In the embodiment of the invention shown in FIG. 2 the active elements or transistors T3 and T4 which supplement the active switching elements or transistors T1 and T2 of the first balanced modulator circuit to form the differential amplifiers simultaneously form the active switching elements of a second balanced modulator circuit controlled with the same carrier frequency wave input signal in order to convert a second modulating input signal. As with the circuit of FIG. 1 the first balanced modulator circuit consists of transistors T1 and T2 and transformers T*r*1 and T*r*2 with input E1 and output A1. In this embodiment, however, a second balanced modulator circuit consisting of transistors T3 and T4 connected in push-pull arrangement between transformers T*r*3 and T*r*4 with input E2 and output A2 is provided. One transistor, i.e., T1 or T2 of one of the balanced modulators forms a differential amplifier with one transistor, i.e., T3 or T4, respectively, of the second balanced modulator with an emitter series resistance R1 or R2 respectively common to both transistors. Only one of the two balanced modulators, in the illustrated embodiment the one including T3 and T4, is directly controlled by the carrier frequency input signal fed in at terminal T which in the conventional manner is connected to the center tap of the secondary winding of transformer T*r*3. Thus at every instant only the transistors of one of the two balanced modulator circuits, e.g., transistors T1 and T2, are conductive while the transistors of the other balanced modulator circuit are blocked.

The embodiment of FIG. 2 has the particular advantage of eliminating the need for additional active elements in order to generate rectangular or square wave carrier frequency signals for a pair of balanced modulator circuits.

According to a further feature of the invention the circuit of FIG. 1 can be further modified to form a ring-type or double balanced modulator circuit. Such a modification is shown in FIG. 3 wherein like components are again given the same reference numeral.

Figure 3:
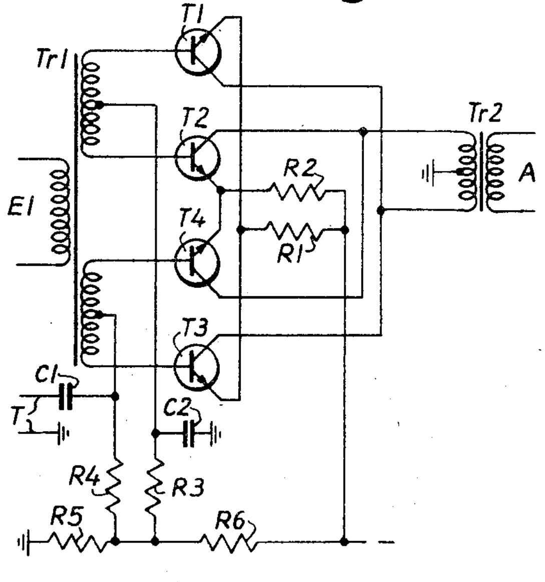
FIG. 3 is a schematic circuit diagram illustrating a modification of the circuit of FIG. 1 to form a ring-type balanced modulator.

As shown in FIG. 3, the ring-type or double balanced modulator circuit according to the invention consists of the circuit of FIG. 1 including the basic balanced modulator circuit having transistors T1 and T2 as the active switching elements and the two differential amplifiers formed by the transistors T1 and T3 and T2 and T4 respectively. In this embodiment, however, the transistors T3 and T4 are connected in a push-pull arrangement in the diagonal arms or branches of the circuit between the transformers T*r*1 and T*r*2. In order to achieve this connection the transformer T*r*1 is provided with a second center tapped secondary winding each end of which is connected to the base of a respective one of the transistors T3 and T4, while the collectors of these transistors are connected in common with the respective transistor with which they form a differential amplifier, i.e., the collectors of transistors T1 and T2 respectively. Either transistors T1 and T2, which are in the longitudinal branches of the ring-type balanced modulator circuit or, as in the illustrated embodiment, transistors T3 and T4 in the diagonal branches of the circuit are directly controlled through their bases by the carrier frequency input signal applied at terminal T. As with the embodiment of FIG. 1, the opposite phase control of the transistors in the branches not directly controlled by the carrier wave input signal, transistors T1 and T2 in the longitudinal branches in the illustrated embodiment, is accomplished via the common emitter connections which are coupled via an emitter series resistance R1 or R2 of the respective differential amplifiers.

In addition to the advantage of the elimination of structural components for a separate generator to form a rectangular or square carrier frequency wave, the circuit of FIG. 3 for a ring-type balanced modulator circuit exhibits the second, substantial advantage that it is not necessary in this modulator, as it is with the conventional ring-type balanced modulator circuit, to provide an additional transformer for the carrier frequency input signal in order to provide an opposite-phase control of the active circuit elements in the longitudinal or diagonal branches, respectively.

It will be understood that the above description of the present invention is susceptible to various modifications, changes and adaptations, and the same are intended to be comprehended within the meaning and range of equivalents of the appended claims.

I claim:

1. In an active balanced modulator circuit having first and second active switching elements connected in push-pull arrangement between a first input for the modulating signal and the modulator circuit output, and having a second input for a sinusoidal carrier wave signal, the improvement comprising: third and fourth active switching elements, said third switching element being coupled to said first switching element to form a first differential amplifier and said fourth switching element being coupled to said second switching element to form a second differential amplifier; said second input being directly coupled to and directly controlling the switching of only said third and fourth switching elements so that said first and second switching elements are switched between their respective conducting and nonconducting states in sudden jumps by the control voltages therefore produced in the respective differential amplifiers by the sinusoidal carrier wave input signal.

2. The balanced modulator circuit as defined in claim 1 wherein said third and fourth switching elements are simultaneously connected in push-pull relationship between a further modulating signal input and further modulator circuit output to form a second balanced modulator circuit controlled by the same carrier wave signal applied at said second input.

3. The balanced modulator circuit as defined in claim 1 wherein said third and fourth switching elements are connected in push-pull arrangement in the diagonal branches of said balanced modulator circuit between said first input and said modulator circuit output to form a ring-type balanced modulator circuit with said first and second switching elements.

4. The balanced modulator circuit as defined in claim 1 wherein said switching elements are transistors and wherein the collectors of said third and fourth switching elements are connected via a common series resistance to a point of reference potential so that an amplified square wave of the input carrier frequency is produced across said series resistance.

5. The balanced modulator circuit as defined in claim 1 wherein all of said switching elements are transistors; wherein the bases of all of said transistors have the same bias voltage which is selected so that all of the transistors draw a uniform average collector-emitter current in the absence of a carrier wave input signal; wherein said second input is coupled to only the bases of said third and fourth transistors to thereby control the switching thereof by the sinusoidal carrier wave input signal; and wherein the opposite phase control of the other transistor of each of said first and second differential amplifiers is achieved by the connection of the emitters of the transistors of the same differential amplifier to each other and via a common series resistor to a source of operating potential.

6. The balanced modulator as defined in claim 5 wherein said first input for the modulating signal comprises the primary winding of a first transformer having a center tapped secondary winding the ends of which are connected to the respective bases of said first and second transistors and the center tap of which is connected to a point of reference potential via a capacitor; and wherein said modulator circuit output comprises the secondary winding of a second transformer having a center tapped primary winding the ends of which are connected to the respective collectors of the first and second transistors and the center tap of which is connected to said point of reference potential.

7. The balanced modulator circuit of claim 6 wherein said second input is coupled to the bases of said third and fourth transistors, the collectors of which are connected in common to said point of reference potential.

8. The balanced modulator circuit as defined in claim 6 wherein said third and fourth transistors are simultaneously connected in push-pull relationship between a further modulating signal input and a further modulator circuit output to form a second balanced modulator circuit controlled by the same carrier wave signal applied at said second input; wherein said further modulating signal input comprises the primary winding of a third transformer having a center tapped secondary winding the ends of which are connected to the respective bases of said third and fourth transistors and the center tap of which is connected to said second input; and wherein said further modulator circuit output comprises the secondary winding of a fourth transformer having a center tapped primary winding the ends of which are connected to the respective collectors of said third and fourth transistors and the center tap of which is connected to said point of reference potential, whereby said circuit includes two balanced modulator circuits controlled by the same carrier wave signal applied at said second input.

9. The balanced modulator circuit as defined in claim 6 wherein said first transformer has a second center tapped secondary winding the ends of which are connected to the respective bases of said third and fourth transistors and the center tap of which is connected to said second input; and wherein the collector of said third transistor is directly connected to the collector of said first transistor and the collector of said forth transistor is directly connected to the collector of said second transistor, whereby said third and fourth transistors are connected in push-pull arrangement in the diagonal branches of said balanced modulator circuit between said first input and said output to form a ring-type balanced modulator circuit.

* * * * *